United States Patent [19]

Compton

[11] 4,456,881
[45] Jun. 26, 1984

[54] GRADIENT-COIL APPARATUS FOR A MAGNETIC RESONANCE SYSTEM

[75] Inventor: Russell A. Compton, Chesterland, Ohio

[73] Assignee: Technicare Corporation, Solon, Ohio

[21] Appl. No.: 340,546

[22] Filed: Jan. 18, 1982

[51] Int. Cl.³ ............................................. G01R 33/08
[52] U.S. Cl. ...................................... 324/319; 324/309
[58] Field of Search ................ 324/300, 309, 319, 322

[56] References Cited

U.S. PATENT DOCUMENTS 4,284,948  8/1981  Young .................................. 324/309
4,354,499  10/1982  Damadian ........................... 324/309

Primary Examiner—Michael J. Tokar

[57] ABSTRACT

Apparatus for imposing a gradient magnetic field intensity on a static magnetic field intensity in a nuclear-magnetic-resonance (NMR) system. The gradient field has a predetermined error relationship with respect to a desired characteristic of the gradient field within a selected region. The selected region is substantially smaller in volume than the volume "enclosed" by a surface or surfaces on which electrical conductors are distributed to generate the gradient field. The surface current densities in a grid-like pattern of differential areas on the surfaces are chosen such that, within the selected region, the predetermined error relationship results. The gradient field intensity outside of the selected region generally does not have the characteristic desired within the region. The predetermined error relationship can be established in a linearly-varying field intensity in a spherical volume enclosed by a cylindrical surface. Generally hyperbolically-shaped electrical coils on the cylindrical surface can provide surface current densities required for a constant transverse-gradient (a linearly varying magnetic field intensity in a direction transverse to the axis of the cylinder).

18 Claims, 9 Drawing Figures

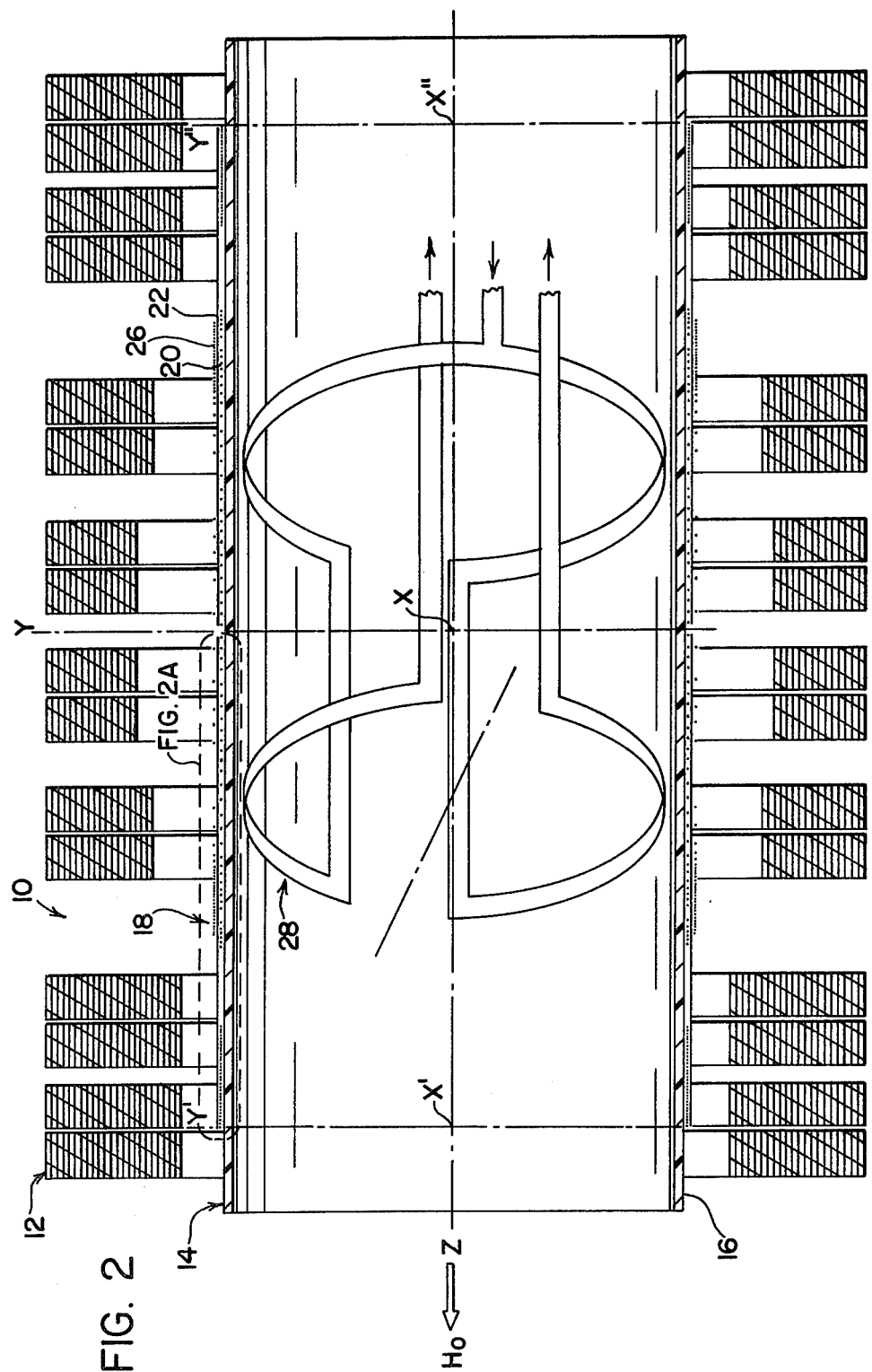

FIG. 5

| X-Y PLANE | | | | | | | OCTANT I' | | | | | | | |
|---|---|---|---|---|---|---|---|---|---|---|---|---|---|---|
| 4.72 | 12.5 | 20.3 | 28.0 | 35.8 | 43.6 | 49.5 | 55.5 | 61.4 | 67.3 | 73.3 | 75.6 | 78.0 | 80.4 | 82.7 | 85.1 |
| 4.58 | 12.5 | 20.5 | 28.4 | 36.4 | 44.3 | 50.3 | 56.3 | 62.3 | 68.3 | 74.3 | 76.6 | 79.0 | 81.3 | 83.6 | 86.0 |
| 4.43 | 12.5 | 20.7 | 28.8 | 36.9 | 45.0 | 51.1 | 57.1 | 63.2 | 69.3 | 75.3 | 77.7 | 80.0 | 82.3 | 84.6 | 86.9 |
| 4.29 | 12.6 | 20.9 | 29.2 | 37.4 | 45.7 | 51.9 | 58.0 | 64.1 | 70.2 | 76.4 | 78.7 | 80.9 | 83.2 | 85.5 | 87.8 |
| 4.15 | 12.6 | 21.1 | 29.5 | 38.0 | 46.4 | 52.6 | 58.8 | 65.0 | 71.2 | 77.4 | 79.7 | 81.9 | 84.2 | 86.4 | 88.7 |
| 4.00 | 12.6 | 21.3 | 29.9 | 38.5 | 47.2 | 53.4 | 59.7 | 65.9 | 72.2 | 78.4 | 80.7 | 82.9 | 85.1 | 87.4 | 89.6 |
| 5.00 | 12.6 | 20.2 | 27.8 | 35.3 | 42.9 | 48.9 | 54.8 | 60.8 | 66.7 | 72.7 | 74.9 | 77.2 | 79.4 | 81.7 | 84.0 |
| 6.01 | 12.5 | 19.1 | 25.6 | 32.2 | 38.7 | 44.3 | 50.0 | 55.6 | 61.2 | 66.9 | 69.2 | 71.4 | 73.7 | 76.0 | 78.3 |
| 7.01 | 12.5 | 18.0 | 23.5 | 29.0 | 34.5 | 39.8 | 45.1 | 50.4 | 55.8 | 61.1 | 63.4 | 65.7 | 68.0 | 70.3 | 72.7 |
| 8.01 | 12.5 | 16.9 | 21.3 | 25.8 | 30.2 | 35.3 | 40.3 | 45.3 | 50.3 | 55.3 | 57.6 | 60.0 | 62.3 | 64.7 | 67.0 |
| 9.01 | 12.4 | 15.8 | 19.2 | 22.6 | 26.0 | 30.7 | 35.4 | 40.1 | 44.8 | 49.5 | 51.9 | 54.2 | 56.6 | 59.0 | 61.4 |
| 10.1 | 18.0 | 26.0 | 33.9 | 41.9 | 49.8 | 57.5 | 65.2 | 72.9 | 80.6 | 88.3 | 90.2 | 92.1 | 94.0 | 95.9 | 97.8 |
| 11.1 | 23.6 | 36.1 | 48.6 | 61.1 | 73.6 | 84.3 | 95.0 | 106 | 116 | 127 | 129 | 130 | 131 | 133 | 134 |
| 12.1 | 29.2 | 46.3 | 63.3 | 80.4 | 97.4 | 111 | 125 | 139 | 152 | 166 | 167 | 168 | 169 | 170 | 171 |
| 13.2 | 34.8 | 56.4 | 78.0 | 99.6 | 121 | 138 | 155 | 171 | 188 | 205 | 205 | 206 | 206 | 207 | 207 |
| 14.2 | 40.4 | 66.5 | 92.7 | 119 | 145 | 165 | 185 | 204 | 224 | 244 | 244 | 244 | 244 | 244 | 244 |
| X'-Y' PLANE | | | | | | | RETURN CURRENT | | | | | | | |
| -122 | -284 | -446 | -608 | -770 | -932 | -1063 | -1195 | -1327 | -1459 | -1591 | -1621 | -1651 | -1681 | -1711 | -1741 |
| 0 | | π/8 | | | | π/4 | | | | 3π/8 | | | | π/2 |

ANGULAR POSITION

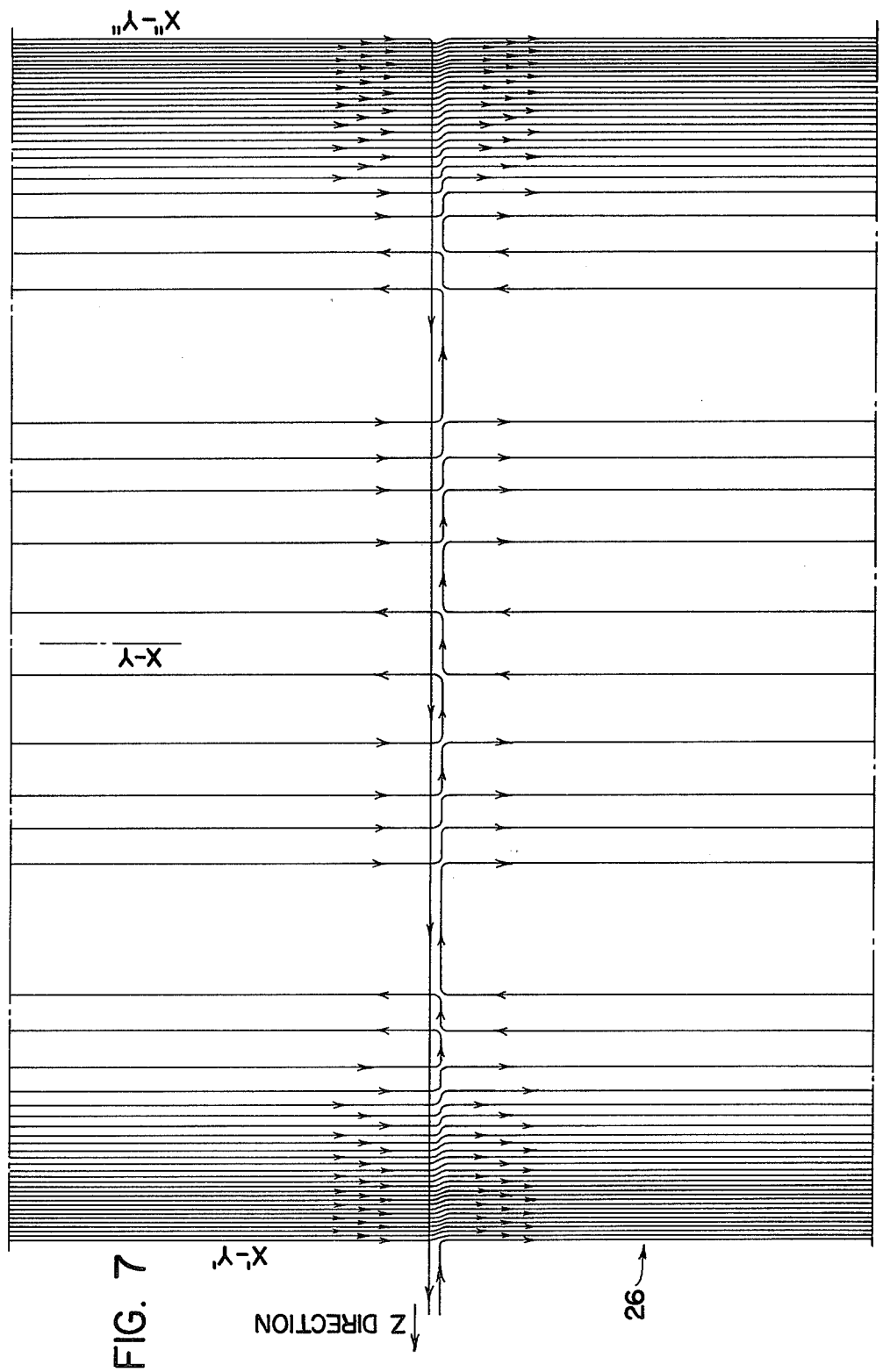

GRADIENT-COIL APPARATUS FOR A MAGNETIC RESONANCE SYSTEM

BACKGROUND

This invention relates to an improved gradient-coil apparatus for imposing a gradient on the static magnetic field in a selected region of predetermined volume. More particularly, the invention relates to a gradient-coil apparatus suitable for use in a system for generating magnetic resonance in materials placed in the system for examination. The magnetic resonance system, in which the improved gradient-coil apparatus is used, includes a magnet for providing a static magnetic field along an axis. Gradients in the static magnetic field, in directions both transverse to and parallel with the axis of the magnet, are required in magnetic resonance systems in which control of magnetic-field intensity at various locations in a material being examined is desired.

The term "magnetic resonance system" refers to a system that employs the phenomenon known as magnetic resonance or nuclear magnetic resonance (NMR) to determine characteristics of materials placed within the system. The system generates magnetic resonance in the materials by exposure of them to a radio-frequency magnetic field having components transverse to the line or axis along which a static magnetic field is directed. For the purpose of controlling or detecting the occurrence or degree of magnetic resonance at various locations in the material to be examined, gradients must be imposed upon the static magnetic field. By selective variation of the gradients in the three dimensions within the region in which the material to be examined is located, it is possible to obtain data from, and form images of, planes or sections of the material. Programmed variation of the magnetic-field gradients may be used in the acquisition of data.

The static magnetic field of a magnetic resonance system generally is produced by a solenoid magnet having a field intensity directed along its axis (usually denominated the Z-axis). The corresponding flux density usually is one or more kilogauss (0.1 webers per m$^2$). In planes transverse to this Z-axis, that is, in planes parallel to the X-Y plane, a gradient is caused to occur. A gradient in the longitudinal or Z-direction also is used. Prior art techniques typically have placed coils on a cylindrical surface having an axis coinciding with the axis of the magnet. The Z-gradient coils have been loops of wire positioned along the axis; the transverse-gradient coils have been rectangular in shape and usually four are used, two on each side of the cylinder. The transverse-gradient coils on opposite sides are positioned across from one another and are made to conform to the surface of the cylinder. An example of this structure is shown in U.S. Pat. No. 4,254,778 issued Mar. 10, 1981 to Clow et al and in U.S. Pat. No. 4,284,948 issued Aug. 18, 1981 to Young.

The prior-art gradient coil devices generally have proven unsatisfactory for the production of outstanding images in digital image processing of magnetic-resonance data as applied to potential human medical diagnostic applications. The gradient-coil apparatus of the present invention improves on the prior-art gradient-coil designs by providing magnetic-field gradients, imposed on a static and preferably uniform and homogeneous magnetic field, that are of a selected characteristic within a predetermined volume located within the spatial region enclosed by the magnet producing the static magnetic field. The characteristic particularly desired in magnetic-resonance imaging systems is a constant gradient in all of the orthogonal X and Y (transverse) and Z directions of the magnetic field as a function of position within the field.

SUMMARY OF THE INVENTION

The gradient-coil apparatus of the invention is used in a system for generating magnetic resonance in materials that are placed in the system for examination. The system has a magnet for providing a static magnetic field and has a gradient-coil subsystem for imposing a gradient on the static magnetic field. The gradient produces a variation in magnetic-field intensity as a function of position in a region in which the gradient is effective.

In accordance with the invention, an improved gradient-coil apparatus is provided for imposing a gradient on the static magnetic field in a selected region of predetermined volume. The improved apparatus comprises at least one surface surrounding the selected region; the surface or surfaces enclose or encompass, in the sense of bringing within its or their bounds, a volume substantially larger than the selected region. The apparatus further comprises at least one electrical conductor positioned in proximity to the surface or surfaces, the conductor or conductors providing a plurality of current paths on the surface or surfaces. Current flowing through such current paths generates a magnetic field in the selected region which magnetic field has a predetermined error relationship with respect to a desired characteristic for the gradient imposed on the static magnetic field.

Typically, the desired characteristic of the gradient is that it be constant, which means that the magnetic field produced by the gradient system varies linearly as a function of position. The invention substantially improves the gradient systems of the prior art by the imposition of the desired characteristic of the gradient field in a selected region of predetermined volume. This volume is enclosed by the surface in proximity to which electrical conductors are positioned. The surface (or surfaces) encloses a much larger volume than the selected region. It is this characteristic that allows precise determination and control of the difference or error between the actual magnetic-field gradients and the desired characteristic for the gradients within the selected region. This is achieved by control of the current paths and current density in proximity to the surface in a manner which produces the predetermined error relationship.

The invention may be better understood by reference to the detailed description which follows and to the drawings.

BRIEF DESCRIPTION OF THE DRAWINGS

FIG. 2 is a sectional view, on a reduced scale, of a currently-preferred form of magnetic-resonance system having gradient-coil apparatus according to the invention;

FIG. 5 is a chart of relative current levels required in each of the eight octants of the cylindrical surface of FIGS. 3 and 4, the numbers in the chart of FIG. 5 representing ampere-turns required to produce a predetermined error relationship with respect to a desired linearity of the Y-gradient within the selected region shown in FIG. 3;

FIG. 7 is a developed view of a gradient-coil apparatus in accordance with the invention for producing a gradient in the Z-direction, the direction of the axis of the magnet used to generate the static magnetic field in the magnetic resonance system.

DETAILED DESCRIPTION

Figure 1:
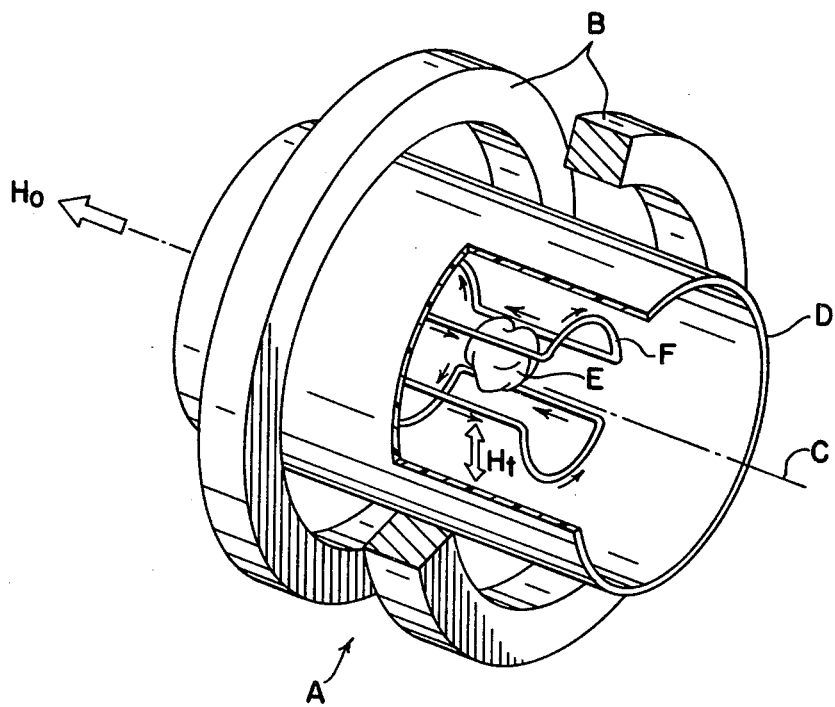
FIG. 1 is a prior art system for generating and detecting magnetic resonance in materials placed in the system for examination.

With reference now to the drawings, wherein like numerals refer to like parts or elements in the several views, there is shown in FIG. 1 a perspective view of the major components of a prior art system that may be used for generating and detecting magnetic resonance in materials placed in the system for examination. The magnetic-resonance system, generally designated by the letter A, does not illustrate the electronic and computer subsystems normally required for use in magnetic-resonance spectroscopic or imaging applications, but does show the environment in which the improved apparatus of the invention is used. The system of FIG. 1 includes a Helmholtz coil pair B used to generate a large, static, homogeneous magnetic field in a direction parallel to a line or axis C. Within a cylinder D of nonmagnetic material, a specimen or material E may be placed for examination using the magnetic-resonance phenomenon. The material E is placed on the axis C and is located within a saddle-shaped coil F. The saddle-shaped coil F is of no importance in regard to the present invention, but is required in magnetic-resonance applications and is representative of prior-art devices used to generate a radio-frequency (RF) field in the material placed in the system for examination. The RF field, when in the presence of a static magnetic field $H_o$, causes the occurrence of magnetic resonance in nuclei of certain elements, such as hydrogen, in the material to be examined.

The direction of the static magnetic field $H_o$ produced by the coil pair B is indicated by an arrow. Currents are made to flow in the radio-frequency coil F having relative directions as indicated by the small arrows adjacent the RF coil elements. The direction of the currents reverse each half-cycle of the alternating RF current in coil F. This produces the transverse magnetic field $H_t$ indicated in FIG. 1. $H_t$ is of low magnitude compared to $H_o$. The magnitude of the flux density resulting from the static magnetic-field intensity $H_o$ may be on the order of several kilogauss.

In magnetic-resonance imaging systems $H_o$ continually is present while the material E is in the system for analysis or examination. The radio-frequency transverse magnetic field $H_t$ is applied for only a time sufficient to allow the protons in the hydrogen atoms (or the nuclei of other atoms exhibiting the magnetic resonance phenomenon) to be affected such that precession of the net magnetization of the material E occurs. The precession of the net magnetic field associated with the nuclei in the material E occurs at the Larmor frequency, which is directly proportional to the magnitude of the magnetic field at the location of the nuclei.

In magnetic-resonance imaging systems, it is necessary to provide various coils (not shown in FIG. 1) for producing gradients that are imposed upon the static magnetic field within the region in which the material E to be examined is placed. In prior-art imaging systems, the gradient-coil apparatus is positioned on the outside of a cylindrical surface, such as the surface D, which may be used as a support structure for the gradient coils.

The gradient coils may produce gradients in any of the three orthogonal directions X, Y and Z. Conventionally, the direction of the axis C is designated as the Z-direction or Z-axis and the X and Y axes of the coordinate system are orthogonal to the Z-axis and to one another.

A gradient is definable as a vector obtained from a real function whose components are the partial derivatives of the function. Thus, the gradient measures the rate of change of the function in a given direction. In magnetic resonance imaging systems, the gradient should be a constant, that is, the total magnetic field in the Z-direction should, whenever magnetic resonance data is being obtained, vary linearly as a function of position within the region of interest in the cylinder D. There can be a gradient in the Z-directed magnetic field which gradient has components in the X direction, in the Y direction, and in the Z direction. Mathematically stated, the desired linear variation in the magnetic field in the Z-direction is as follows:

$$H_z = H_o + G_{zx}X + G_{zy}Y + G_{zz}Z. \qquad (1)$$

In the above equation, the gradients in the X, Y and Z directions are designated by the constant G with subscripts denoting, respectively, that the gradient is in the Z-directed component of a magnetic field intensity and the direction of the gradient component.

In general, prior art gradient-coil apparatus has comprised coils of varying designs intended to produce linear gradients within the whole volume of the cylinder D. Some of the gradient-coil subsystems used in magnetic-resonance systems may have attempted to produce constant gradients (linear field variation) primarily within the region in which a material to be examined is to be placed. This becomes more difficult as the size of the systems increase. Systems large enough to accommodate the human body within the volume enclosed by the cylinder D present particular problems, but medical diagnostic imaging applications of magnetic resonance require the use of such equipment.

The prior-art apparatus used to generate X and Y gradients in the magnetic-field components directed in the Z-direction has been in the form of rectangular coils that are laid flat on the outer surface of the cylinder D. Typically, two such coils are provided on each side of the cylinder D. The coils are spaced along the axis C and are positioned opposite one another, there being a total of four coils for each gradient produced in either of the transverse X or Y directions. A gradient in the Z-direction can be obtained quite simply with the use of conductive loops having their axes concentric with the axis C. The loops for the Z-gradient can be spaced from one another along the axis C. The configuration of the typical transverse (X or Y) gradient coils may be seen in the aforementioned U.S. Pat. Nos. 4,254,778 and 4,284,948.

The gradient-coil apparatus of the present invention may take any one of many possible configurations. The invention makes use of distributed electrically-conductive paths on a surface enclosing a selected region in which examination of a material is to take place. The material may be the human form, or, a portion thereof. The selected region has a predetermined volume (shape and size) and is enclosed by a surface the interior of which occupies a volume substantially larger than that of the selected region.

Conductive elements are placed in proximity to the surface. Currents in the conductive elements or paths are controlled so that, within the selected region, the current flowing through the current paths generates a magnetic field which has a predetermined *error* relationship with respect to a desired characteristic for the magnetic field. This desired characteristic is linearity of the imposed magnetic field as a function of position in a given direction within the selected region. Such field has a constant gradient G [equation (1)]. Outside of the selected region, even though within the volume enclosed by the cylindrical or other surface, the gradient is of no particular import.

Figure 2A:
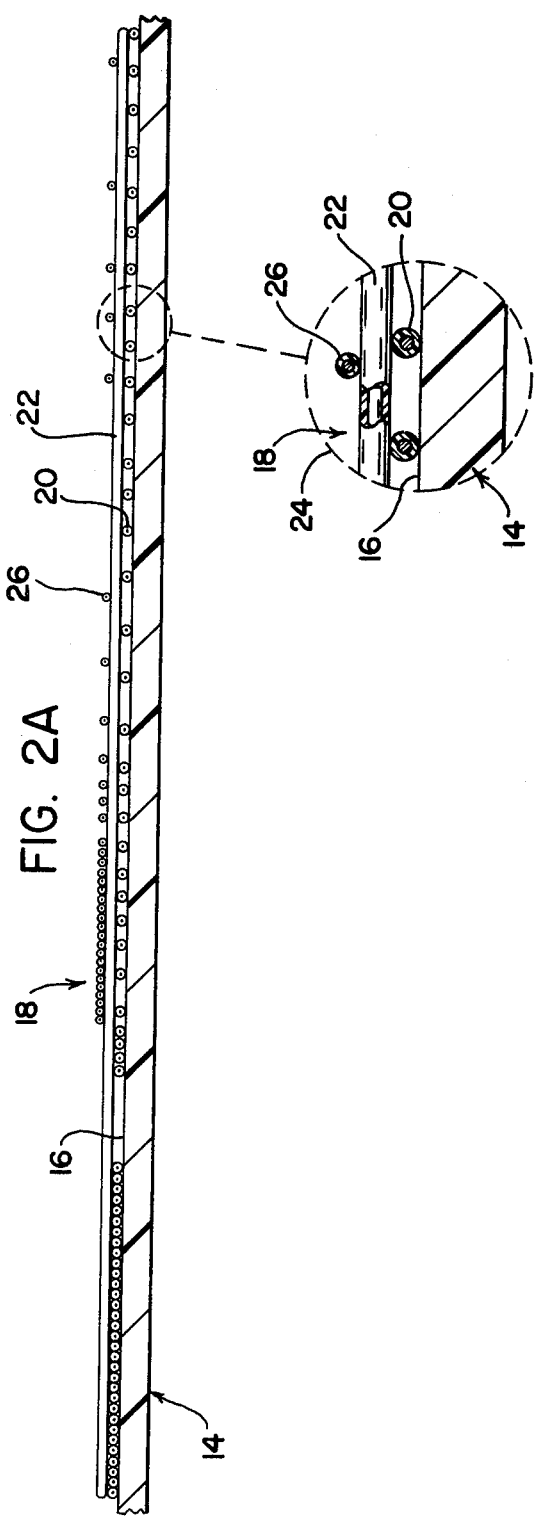
FIG. 2A is an enlarged view of a portion of the apparatus, as indicated in FIG. 2.

With particular reference now to FIG. 2, there is shown a magnetic-resonance system generally designated by the numeral 10. The system includes a resistive-type magnet 12, comprising a series of electrical coils wound from flat conductive strip, and aligned along a common axis Z. The magnet 12 comprising these coils generates a large magnetic field intensity, on the order of 80,000 amp/m$^2$, and with corresponding flux density (about 0.1 weber/m$^2$) having a high degree of uniformity in the Z-direction. The field intensity is designated $H_o$ in FIG. 2.

A nonconductive, nonmagnetic cylinder 14 of circular cross-section is coaxially positioned within the magnet 12. This cylinder has a surface 16 on which X, Y and Z gradient coils 18 are positioned. The gradient coils 18 are formed from electrically conductive elements positioned in proximity to the surface 16 of the cylinder 14. The X and Y gradient coils are designated, respectively, by the numerals 20 and 22 in the portion of the cylinder cross-section shown at 24 in the enlarged view of FIG. 2A. The Z-gradient coil is designated by the numeral 26.

The midplane of the gradient-coil apparatus passes through the Y-axis indicated in FIG. 2. The X-axis is orthogonal to both the Y-and Z-axes and, thus, is perpendicular to the plane of the paper at the intersection of these axes. The X-Y plane is the midplane of the gradient-coil apparatus.

The radio-frequency coil 28 is symmetrically-positioned with respect to the mid or X-Y plane and is illustrated as a "saddle" coil, the coil design typically encountered in current NMR imaging systems. The RF coil 28 forms no part of the present invention and is shown merely to illustrate its presence in the magnetic resonance imaging system 10.

The material to be examined or analyzed in the magnetic resonance system 10 is placed at the intersection of the X-, Y- and Z-axes and within the RF coil 28. To produce an image of a plane of a material or portion of the human anatomy to be examined within the RF coil 28, it is necessary to use the gradient coils 20, 22 and 26 in the control and/or detection of magnetic resonance at various locations in the material to be examined.

Figure 3:
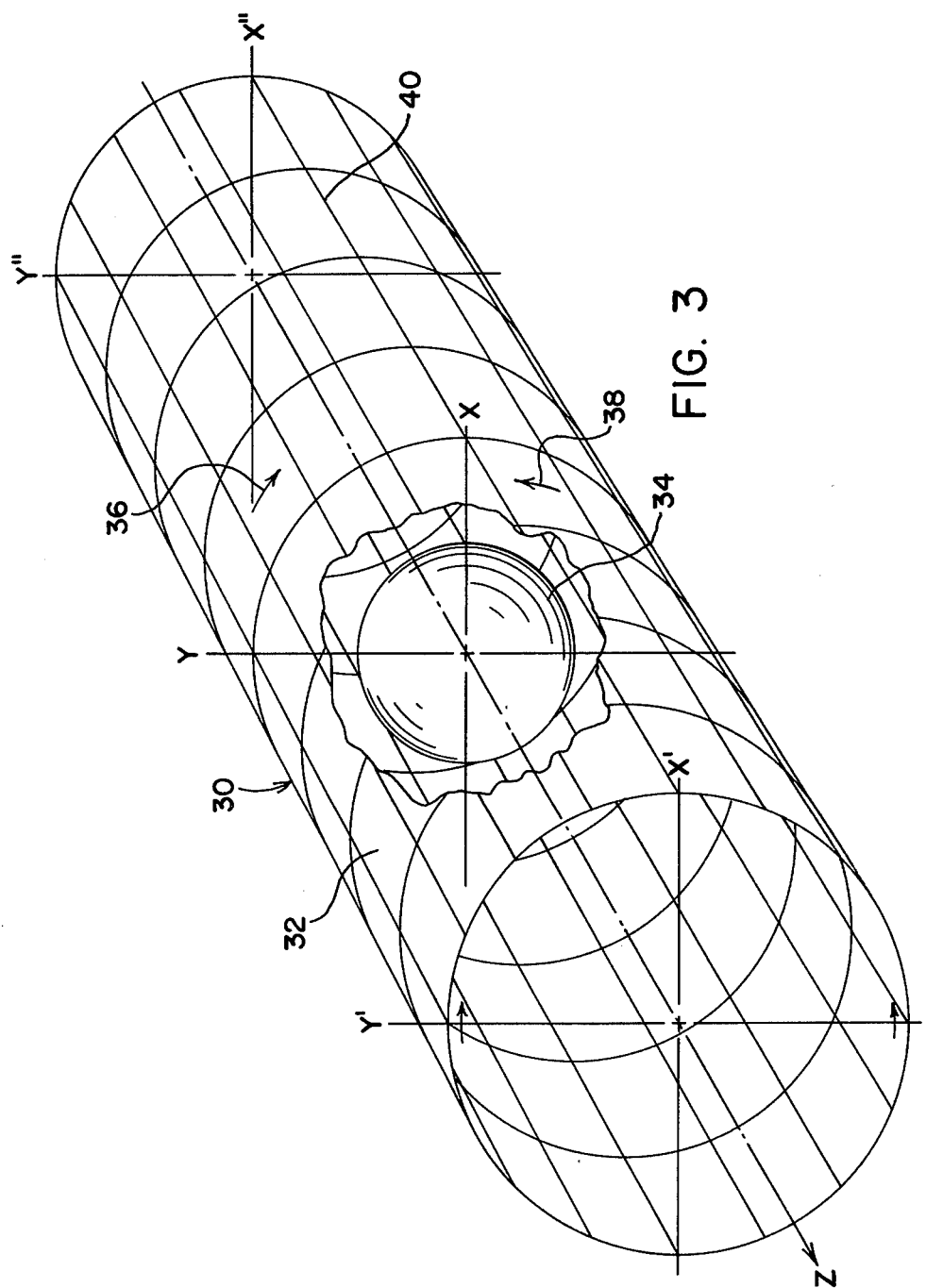
FIG. 3 is a perspective view of a cylindrical surface having a grid structure imposed on it and enclosing within it a selected region of predetermined volume, the volume being a sphere.

In FIG. 3, there is shown an imaginary surface 30, which represents one of the planes in which a set of X or Y gradient coils are located in proximity to the surface 16 of the cylinder 14. The intersecting X'-Y' axes in FIG. 3 are located at the end of the surface 30 and correspond to the left-hand end of the gradient-coil apparatus 18 in FIG. 2. Similarly, an axis Y'' can be seen in FIG. 2 at the right-hand end of the gradient-coil apparatus 18 and is one of the intersecting axes X'''-Y''' in FIG. 3. The cylindrical surface 30 is located between the X'-Y' set of axes and X'''-Y''' set of axes. The X-Y set of axes define the midplane passing through the surface 30. The Z-axis in FIG. 3 passes through the origins of the X-Y, X'-Y', and X'''-Y''' sets of axes.

The surface 30 is divided into a total of one-hundred twenty-eight (128) small surface areas 32 which are of equal size. There are 16 of these surface areas in each of the eight octants of the surface 30. Each octant is bounded by lines interconnecting the intersections with the surface 30 of the X-Y, X'-Y', and X'''-Y''' sets of axes. The X-Z plane may be regarded as a zero angle reference plane; positions of points on the surface 30 may be identified by their locations along the Z-axis and by the angle between the positive X-axis and a line connecting each point with the Z-axis. This allows angles to be measured in a counter-clockwise direction with the zero-reference being the plane passing through the X- and Z-axes.

Surface 30 is a cylinder enclosing a large volume. A substantially smaller, spherical volume 34 is shown positioned with center at the origin of the X-Y-Z set of axes. The spherical volume 34 hereinafter is referred to as the "selected region" and is substantially smaller in volume than the larger volume enclosed by the surface 30.

The currently-preferred gradient-coil apparatus in accordance with the invention provides a magnetic field within the selected region 34 that has a predetermined *error* relationship with respect to the desired characteristic of the gradient. The desired characteristic is linear variation, as a function of distance from the origin along the gradient direction, in the magnetic field imposed upon the main magnetic field produced by the magnet 12 (FIG. 2). The rate-of-change, or gradient, of a linearly varying field is a constant. The magnetic field provided by the gradient-coil apparatus at locations outside of the selected region 34 is deliberately allowed to have nonlinear characteristics in order to allow a lesser degree of deviation (error) from the desired linearity in the selected region 34.

If electrical currents are made to flow in each of the small surface areas 32 in FIG. 3, these currents will have an effect on the net magnetic field intensities within the selected region 34. Net circumferential currents in each of the surface areas 32, as indicated by the arrows 36 and 38, produce magnetic field intensities having components in the Z-direction. An important feature of the present invention is the control of the various currents in the surface areas 32 such that the resulting magnetic field intensities within the selected region 34 have a predetermined error relationship with respect to the desired magnetic field intensities. Otherwise stated, the magnetic field intensities caused by all of the surface currents in all of the surface areas 32 of the cylindrical surface 30 may be summed together at each of many points or small-volume units within the selected region 34. At each of such points, a magnetic field intensity is produced which deviates from linearity or other desired characteristic in a predetermined manner. Magnetic field intensities outside of the selected region 34 are not of great consequence. These intensities outside the selected region may be allowed to assume any characteristic. This permits the currents in the surface areas 32 to be chosen in a manner that most contributes to the field-intensity characteristics desired in the selected region.

Each of the surface elements 32 in FIG. 3 may be uniquely identified by means of a Z-coordinate position in combination with an angular coordinate $\theta$ representing the angular distance of the differential surface element from the X-Z reference plane. Thus, each incremental surface area 32 is describable by coordinates ($\theta$, Z) and has an effective area $R\Delta\theta\Delta z$, where R is the radius of the cylindrical surface 30. The cylindrical surface has been chosen because of its desirability in magnetic-resonance systems, but one or more other surfaces carrying electrical current may be used in producing the predetermined error relationship with respect to a magnetic-field gradient desired in a selected region within or enclosed by the surface or surfaces.

It is well-known that the magnetic field intensity H at any arbitrary point of interest resulting from a surface current of point density $J_s$ flowing on a differential surface element ds separated from the arbitrary point by a distance r is given by the following relationship:

$$H = \int_S \frac{J_s \times r}{4\pi r^3} ds. \tag{2}$$

Equation (2) above may be used to calculate the magnetic field intensity at each point in the selected region 34 due to the presence of current in each of the surface areas 32. The summation of equation (2) may be used to determine the magnetic field intensity for each point or differential volume element in the selected region 34 resulting from all of the gradient-coil currents illustrated on surface 30 in FIG. 3 (the current $J_s$ being the surface current density measured in amperes per unit width of the surface element ds and S being the total surface area carrying the current $J_s$). Because the gradient-coil apparatus of the invention is concerned only with gradients in Z-directed magnetic field intensities, it is possible to ignore the effects of current components flowing in the direction of the Z-axis.

If only the currents in the surface areas 32 flowing in directions perpendicular to the Z-axis are considered and if the dimensions of the surface areas are small relative to the distances r, equation (2) reduces to the following form:

$$H_{za} = \sum_{b=1}^{n} \frac{R\Delta\partial[I_{yb}(X_b - X_a) - I_{xb}(Y_b - Y_a)]}{4\pi r^3} \tag{3}$$

where the subscript "a" denotes a point or differential volume in the selected region 34, the subscript "b" denotes one of the differential surface areas 32 in FIG. 3 (or a smaller differential area as hereinafter described), the subscripts "x" and "y" are used to designate current components in the orthogonal x and y directions, components in the Z-direction being ignored as stated above, and I is the product of the surface current density in the surface area and the Z-width of the area. The summation is taken over the number "n" of surface elements being considered. The value of $H_z$ at each point of interest "a" is selected in conformity with a desired gradient field. Once a desired value $H_z$ at each point "a" has been selected, various techniques may be used to calculate or approximate a corresponding surface current density required in each of the differential surface areas "b" to produce the field intensity desired at point "a".

Current densities in the differential surface elements "b" generate the magnetic field intensity selected for a point "a". The surface areas "b" preferably are much smaller in area than the surface areas shown for purposes of illustration in FIG. 3. In fact, in a practical application of the gradient-coil apparatus, each of the surface areas 32 is broken up into 16 surface elements, each of which would then correspond to a surface area "b" in equation (3) above.

The point "a" in equation (3) is a differential volume element in the selected region 34. A minimum number of volume elements must be used for the predetermined volume of the selected region 34. The number must be at least as large as the number of surface elements. For example, the spherical volume of this region could be divided into approximately 1,000 differential cubic elements, each of the cubic elements having a center. A computer program may be used to calculate the net currents in each of the differential areas "b" of surface 30 needed to produce the magnetic field intensity desired at the center of each of these cubic or differential elements; the field intensities would vary linearly as a function of distance from the center of the spherical volume if a constant gradient is desired. Any cubic element having a center outside of the selected region 34 would not be considered in the calculation. In the calculation, equation (3) becomes a series of linear equations as follows:

$$H'_{za} = \sum_{b=1}^{n} A_{ab} I_b \tag{4}$$

where $H'_{za}$ is the actual magnetic field intensity at a differential volume element "a", rather than the desired field intensity at such volume element. The symbol $A_{ab}$ represents a rectangular matrix in which each matrix value is the coefficient of the magnetic field intensity at "a" resulting from the current $I_b$ at a differential surface element "b" on the cylindrical surface 30. These field intensities include the effect of current flow in a current-return path necessarily required for the flow of current in conductive elements. (The return paths are more fully described in subsequent paragraphs.)

Equation (4) is, in fact, a series of linear equations that describe the total magnetic field intensities actually produced at points "a" from a collection of surface current densities at the points or surface areas "b". In general, there is no single "collection" of currents in the surface areas "b" that exactly produces the magnetic field intensities desired at all points "a".

In accordance with the invention, a single "collection" of surface current densities for the differential areas of surface or surfaces 30 is chosen. The "collection" of current densities is chosen such that they will produce a predetermined error relationship with respect to the magnetic-field-intensity characteristics, desired in the selected region 34 (which need not be spherical). To accomplish this, a least-squares-error technique can be used in choosing a suitable "collection" of surface current densities.

The error $E_a$ is the difference between the magnetic field intensity desired at each point "a" and the actual field intensity at each of such points, or:

$$E_a = H_{za} - H'_{za} = H_{za} - \sum_{b=1}^{n} A_{ab} I_b. \tag{5}$$

Equation (5) describes the error in the actual magnetic field intensity at a point "a" in the selected region as a result of the set or "collection" of currents $I_b$ on the surface 30. In the use of the least-squares technique, the squares of the errors at each of the points "a" in the selected region are summed and currents $I_b$ are chosen which will minimize the sum of the individual errors squared. Squaring is used because it prevents positive and negative errors from cancelling one another; the square of a negative error is a positive error-squared value. The currents $I_b$ on the surface 30 are those currents which provide a minimum or least-squares error relationship in the total volume of the selected region.

The sum of the point or differential-volume-errors squared, or $E_a^2$, is a measure of the total error and is, over the volume (vol) of the selected region, as follows:

$$\sum_{a=1}^{vol} E_a^2 = \sum_{a=1}^{vol} \left( H_{za} - \sum_{b=1}^{n} A_{ab} I_b \right)^2. \tag{6}$$

The least-squares technique requires that the left side of equation (6) be a minimum for the chosen set of surface current densities. This occurs when the partial derivative of the sum of the differential-volume-errors $E_a^2$, with respect to each of the surface, current densities in the "collection", is equal to zero. This produces the set of equations:

$$\frac{\partial \sum_{a=1}^{vol} E_a^2}{\partial I_c} = \sum_{a=1}^{vol} \left\{ \left[ H_{za} - \sum_{b=1}^{n} A_{ab} I_b \right] (-2 A_{ac}) \right\} = 0 \tag{7}$$

where $I_c$ is used to designate each of the current densities for which the partial derivative of the error function may be calculated and where $A_{ac}$ represents the rectangular matrix obtained when the derivative is taken. Equation (7) when rearranged becomes:

$$\sum_{a=1}^{vol} H_{za} A_{ac} = \sum_{b=1}^{n} I_b \sum_{a=1}^{vol} A_{ac} A_{ab}. \tag{8}$$

Equations (8) are a set of n simultaneous linear equations, which may be solved by any of the well-known techniques available, for example, the method of determinants. The preferred method of solution, however, employs Gaussian eliminition and back-substitution and commercially-available computer programs can be utilized.

The set of surface current densities $I_b$ obtained upon solution of the equations (8) may be regarded as a compromise collection that provides the minimum squared error.

The predetermined error relationship described above is used to establish suitable current densities for each differential surface element of the surface 30. The preferred embodiment of the gradient-coil apparatus is designed using the least-squares-error technique as applied to surface elements each of which is 1/16th of the surface area 32, as was previously mentioned. Once found, the surface current densities can be integrated in directions parallel to the Z-axis until the integration equals the amount of current it is desired to have present in a conductive element or wire to be laid on the surface of the cylinder 30. Each time that desired current level is reached, a conductive path would be laid on the surface 16 of the cylinder 14 (FIG. 2).

The surface current densities needed are net current densities and may be obtained in a variety of ways; the simplest technique or design is not required and may not always be the best choice. It has been found that, for transverse-gradient magnetic-field intensities, current conductors or conductive paths are best which generally describe a hyperbola on the surface of the cylinder 14. This current or coil-gradient apparatus is described in detail hereinafter. However, the current densities required to produce the least-squares-error relationship within the selected region 34 may be obtained with many other designs. The only requirement of such designs is that they be able to produce a net current density in each of the surface areas that conforms to that required to satisfy the predetermined error relationship between the actual magnetic field intensity and that which is desired.

Figure 4:
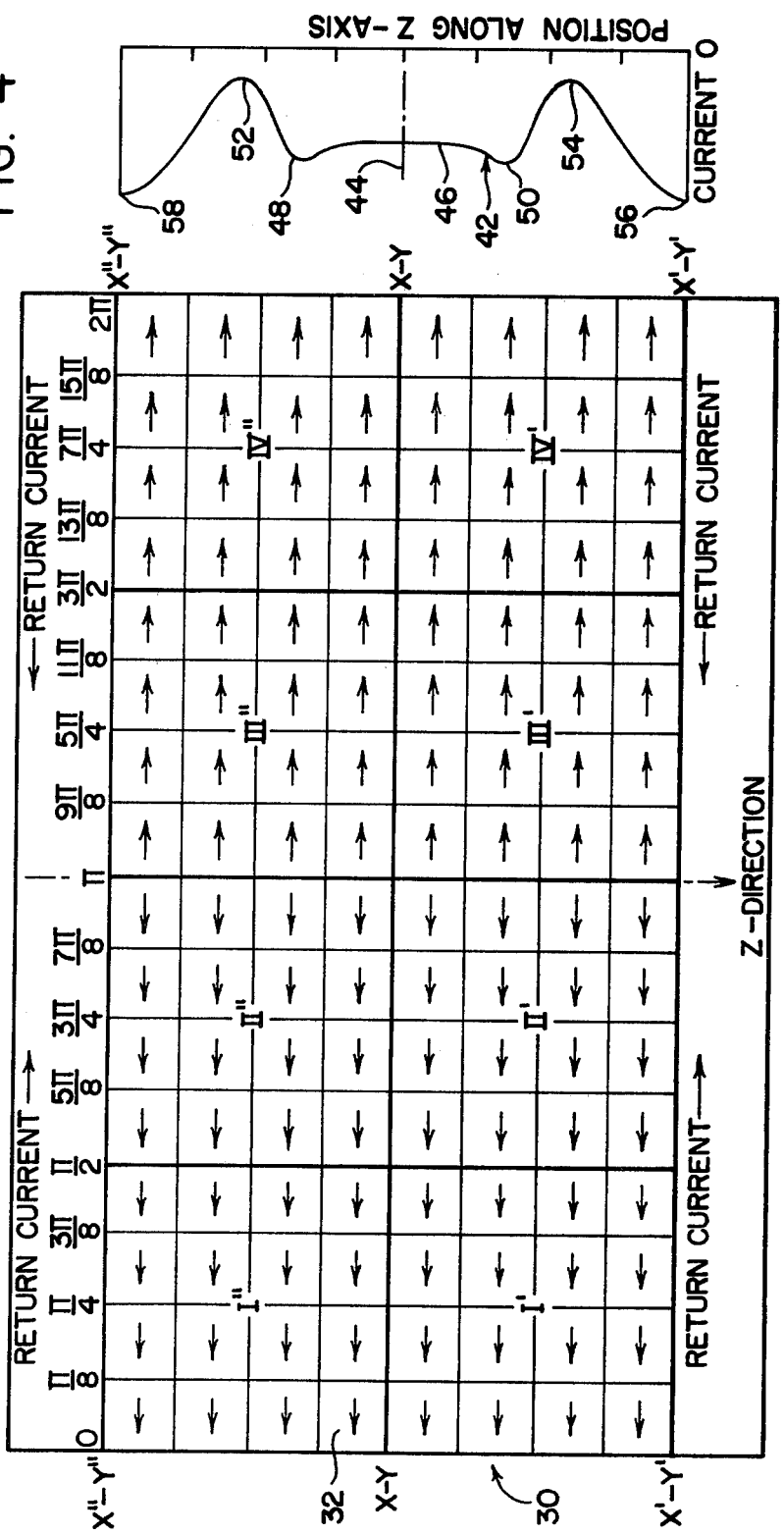
FIG. 4 is a developed view of the cylindrical surface of FIG. 3 and, for production of a transverse-gradient, Z-directed magnetic field, shows desired net direction of current flow in each of the surface areas of the cylindrical surface shown in FIG. 3.

With particular reference now to FIG. 4, there is shown the surface 30 as it would appear if it were cut along the line on the surface between the X' and X" axes, that is, the line 40 in FIG. 3. The cylindrical surface 30 in FIG. 4 is viewed from its interior side. It is as if the cylinder were cut along line 40 and allowed to unroll. This permits the angle designations of FIG. 4 to read from left-to-right, rather than from right-to-left as would occur if the exterior surface of the cylinder were to be observed. The X'-Y', X-Y and X"-Y" planes appear as horizontal lines in FIG. 4.

In FIG. 4, arrows are used to indicate the general direction of current flow in each of the surface areas 32. These net currents can be used to produce magnetic field intensities in the selected region 34 that have the least-squares predetermined error relationship with respect to a characteristic, linear variation, desired for the field intensities in the region. At the top of FIG. 4, a sinusoidal wave represents the current on the surface 30 at a location corresponding to the X-Y plane, the midplane of the surface. Current on the surface from angular positions, in radians, from zero to $\pi$ are indicated as positive currents and reach a maximum level at the position $\pi/2$. Currents at angular positions between $\pi$ and $2\pi$ have currents that are designated as being negative. These currents reach a maximum at the angular position $3\pi/2$.

A curve 42 is shown at the right of FIG. 4 and illustrates current versus position along the Z-axis. The midplane line 44, corresponding to the X-Y plane, is shown. The current levels are those which exist on the surface 30 at the angular position $\pi/2$. In this position on the surface, the currents are at their maximum levels. The current (or current density) is substantially constant in the surface areas adjacent the midplane 44, as is indicated by the numeral 46. As distance from the midplane increases in either direction, the current density increases as shown at 48 and 50. The current at positions more remote from the midplane 44 decreases to minimums at locations 52 and 54. At the X'-Y' and X"-Y" planes, the current rises to its maximum values, as indicated at 56 and 58.

Figure 6:
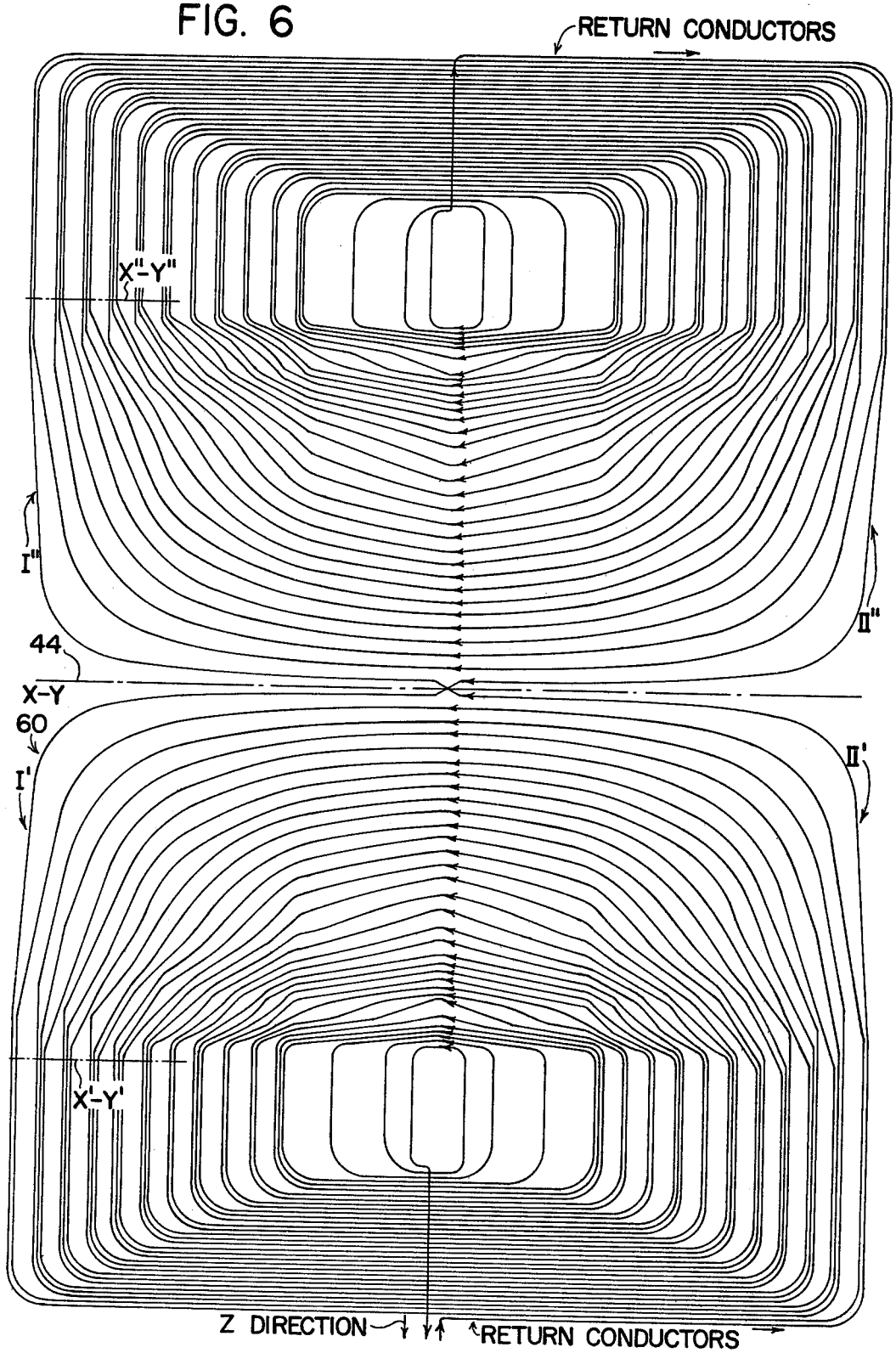
FIG. 6 is a drawing of the generally-hyperbolically-shaped conductors that may be used to produce the current densities of FIGS. 4 and 5.

In FIG. 4, the eight octants of surface 30 are given designations I', II', III', IV', I", II", III", and IV". Two coil assemblies, each identical to the coil assembly shown in FIG. 6, are used in the preferred gradient-coil apparatus to generate the current densities and directions shown in FIG. 4 and further detailed in FIG. 5. The coil assembly of FIG. 6 produces currents required for octants I', II', I", and II". The coil assembly is shown as it looks when laid out on a flat surface, but in practice is curved to conform to the surface 16 of cylinder 14. The conductors of the coil assembly, generally designated by the numeral 60, in the symmetrical regions extending between the X'-Y' and X"-Y" planes, describe a series of curves quite similar to hyperbolic sections of a cone. A hyperbola is the curve obtained by the intersection of a plane with a cone having two nappes, the plane intersecting the nappes of the cone being parallel to its axis.

The direction of current flow in the conductive elements is indicated by arrows on the elements. The two symmetrical halves of the coil assembly are electrically connected in series. The second of the coil assemblies, identical to the assembly shown in FIG. 6, preferably also is connected in series with the coil assembly of FIG. 6 so that only one current flows through the conductors of the entire gradient-coil apparatus. The second coil assembly also is contoured to the surface 16 of cylinder 14 and is positioned opposite the coil assembly shown in FIG. 6. The second coil assembly covers octants III', IV', III", and IV".

FIG. 5 is a numerical table indicating the current levels or densities in octant I'. The amplitudes indicated in FIG. 5 are in units of ampere-turns and are designed to produce a transverse-gradient magnetic field intensity that is linear and that has a maximum magnetic flux density of ten gauss in a selected region in the cylinder 14 having a radius of 8.250 inches. The coil assembly generating the field intensity is to be positioned on a cylinder 14 having a radius of 15.875 inches and having the X'-Y' and X"-Y" sets of axes separated by a distance of 40.0 inches.

The ampere-turn currents in FIG. 5, while being illustrated for octant I' only, are identical in all of the other octants. For example, the corresponding numbers for octant II' can be obtained if the chart of FIG. 5 is rotated about the vertical line designated $\pi/2$. The chart numbers then would be lying face-down in the next octant (octant II'). If these two sets of chart numbers then were to be rotated about the line (which would be extended) representing the X-Y plane in FIG. 5, the chart numbers for octants I" and II" would be obtained. This, then, would provide chart numbers for the entire coil assembly illustrated in FIG. 6. The required second coil assembly would have identical chart numbers, but care must be taken to see that the currents flow in the directions indicated in FIG. 4.

The chart numbers in octant I' illustrated in FIG. 5 are shown for a total of 256 surface elements, whereas the grid structures in FIGS. 3 and 4 only illustrate 16 surface areas 32 in each of the octants. The use of a greater number of elements is desirable in general because a more satisfactory error relationship to the desired field characteristics can be achieved. However, more surface elements can lead to the calculation, using the equations earlier given, of impractically large or oppositely-directed currents in adjacent surface elements.

The various amplitudes of the current densities vary in FIG. 5 in a substantially sinusoidal manner across the chart. The vertical columns of current amplitudes, from the X-Y plane to the X'-Y' plane, can be seen near the X-Y plane to be substantially constant, to increase slightly, to decrease to a minimum, and then to rise again to a maximum current value. This is consistent with curve 42 at the right-hand side of FIG. 4.

If conductive elements or paths in the coil assemblies are to carry a predetermined current, for example 50 amperes, then the diameter of the surface 16 of the cylinder 14 can be used to determine the number of ampere-length units that would be contained in one full electrical turn about the cylindrical surface and transverse to the Z-axis. Each of the surface areas would have an arc-length equal to the radius of the cylinder multiplied by the number of surface areas along a circumferential line on the cylindrical surface, and then divided by $2\pi$ radians. This arc-length, multiplied by the ampere-length units in one turn, would be the number of ampere-turns in one arc-length of the conductor carrying the predetermined current.

If, then, the numbers in the table of FIG. 5 are integrated vertically beginning with the X-Y plane, it can be determined that there should be a conductive element positioned at a specific location each time the integration up to such location reaches a number equal to the calculated number of ampere-turns in one arc-length of the conductor. Any excess ampere-turns would be credited, as an initial condition, in the next integration. When the second integration reaches the ampere-turns number once again, the location of another current conductor on the surface 16 of the cylinder 14 would be determined, and the process would continue.

The coil assembly of FIG. 6 was designed in the manner described above. However, the current-density pattern of FIG. 5 is all that is required; conductive paths of various kinds can be used to produce a pattern of net surface current densities as shown in this chart. Also, the pattern of net current densities can be changed in various ways. The primary feature of the present invention is that a predetermined error relationship is maintained between the actual magnetic field intensity or flux density occurring in a selected region, enclosed by one or more surfaces, and the desired field intensity or flux density in such region. The surface or surfaces need not be continuous closed surfaces, such as the cylinder 30, but could be flat surfaces positioned on opposite sides of the selected region. The predetermined error relationship between actual and desired fields can be established if the selected region is substantially smaller than the volume "enclosed" by the surfaces.

The coil apparatus of FIG. 6 is used to produce a transverse-gradient in the Z-directed magnetic field intensity in the selected region 34. The gradient of the Z-directed field intensity is a vector and is in the Y direction. The coil assembly of FIG. 6 produces the desired constant gradient (linear field variation) in the region 34 and in both the positive Y and negative Y directions. For this purpose, two of the FIG. 6 coil assemblies are positioned opposite one another on the surface 16 of the cylinder 14. Similarly, an X-directed gradient of the axially-directed magnetic field intensity can be obtained with the use of two additional coil assemblies identical to the coil assembly of FIG. 6. This is accomplished by positioning the coil assemblies for the X-gradient $\pi/2$ radians from the positions at which the Y-gradient-coil assemblies are located. Otherwise stated, the X-gradient-coil assemblies would have current densities as shown in FIGS. 4 and 5, but the angular designations in these Figures would be shifted $\pi/2$ radians, such that the new position $\pi/2$ would be at the angular position zero or the angular position $\pi$ as now designated in the Figures.

It may be desired to obtain a gradient in the axially or Z-directed magnetic field which gradient also is in the Z-direction FIG. 7 illustrates conductive elements that may be used to produce a current density on the surface 16 of the cylinder 14 that results in a predetermined error relationship between the desired gradient characteristic in the selected region 34 and the actual gradient obtained.

The conductive elements of FIG. 7 are shown as they would appear if the surface 16 of the cylinder were flat, rather than cylindrical, and illustrates the positioning of the conductive elements between the X'-Y' and X"-Y" planes. The wire positions are chosen so that each of the wires can carry the same current. This allows a single conductor to be used. The conductor can be wound on the cylindrical surface as turns which are coaxial with the Z-axis. Axially-directed conductive portions of the conductor interconnect each of the circular turns distributed along the cylindrical surface. The conductors shown in FIG. 7 are positioned in a manner that, when they carry the same current, produce in the selected region 34 a magnetic field intensity that deviates from a desired linear characteristic in a predetermined manner. The deviation from linearity is the least-squares error determined in a manner analogous to that previously described in connection with the X and Y gradient-coil assemblies.

Figure 8:
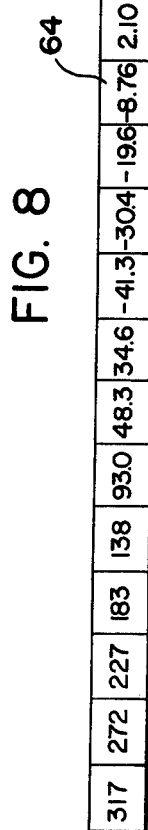
FIG. 8 is a chart of the current densities produced by the gradient-coil apparatus of FIG. 7.

FIG. 8 is a graph depicting the ampere-turn current densities in each of the surface areas 64 located between the X'-Y' and X-Y midplane positions along the cylinder 14. The ampere-turn amounts correspond to fifty amperes per wire turn and are intended to generate a Z-directed-gradient magnetic field intensity producing a magnetic flux density of ten gauss in the selected region 34. Some of the ampere-turn surface current densities shown in FIG. 8 are negative, which indicates that the net direction of current in the surface element must be negative or oppositely-directed with respect to the current in surface elements having positive currents. Examination of the arrows on the conductors in FIG. 7 indicates the direction of the currents in the conductor.

Based upon the foregoing description of the invention, what is claimed is:

1. In a system for generating magnetic resonance in materials placed in the system for examination, the system having a magnet for providing a static magnetic field and having a gradient-coil subsystem for imposing a gradient on the static magnetic field, the gradient producing a variation in magnetic-field intensity as a function of position in a region in which the gradient is effective, an improved gradient-coil apparatus for imposing a gradient on the static magnetic field in a selected region of predetermined volume, the apparatus comprising:
   (a) at least one surface surrounding the selected region; and
   (b) at least one electrical conductor positioned in proximity to the surface or surfaces, the conductor or conductors providing a plurality of current paths on the surface or surfaces, current when flowing through such current paths generating a magnetic field intensity in the selected region which magnetic field intensity exhibits a least-squares error relationship with respect to a desired characteristic for the gradient imposed on the static magnetic field.

2. An improved gradient-coil apparatus according to claim 1, wherein the surface or surfaces includes a cylinder, the selected region being located on the axis of the cylinder.

3. An improved gradient-coil apparatus according to claim 2, wherein the cylinder is a right-circular cylinder.

4. An improved gradient-coil apparatus according to claim 2, wherein the electrical conductor or conductors positioned in proximity to the surface of the cylinder is in the form of a coil wound with turns shaped to have the general contour of the surface of the cylinder.

5. An improved gradient-coil apparatus according to claim 4 which includes a plurality of such coils.

6. An improved gradient-coil apparatus according to claim 4, which includes four of such coils.

7. An improved gradient-coil apparatus according to claim 4 which includes eight of such coils.

8. An improved, gradient-coil apparatus according to claim 4, which further includes a second coil, substantially identical of the first-mentioned coil, the second coil being superimposed on the first-mentioned coil and having corresponding portions positioned $\pi/2$ radians from those of the first-mentioned coil.

9. An improved gradient-coil assembly according to claim 8, which includes four pairs of coils arranged in superimposed relationship as recited in claim 8.

10. An improved gradient-coil apparatus according to any of claims 4 through 9, which further includes gradient-coil means including a plurality of turns of an electrical conductor, each of the turns surrounding the axis of the cylinder, the turns being distributed along the axis of the cylinder to cause an axially-directed magnetic-field gradient to be produced in the selected region, the axially-directed gradient field having a least-squares error relationship with respect to a desired characteristic for the axially-directed gradient.

11. In a system for generating magnetic resonance in materials placed in the system for examination, the system having a magnet for providing a static magnetic field, wherein the magnet for providing the static magnetic field has an axis, the static magnetic field being axially-directed,
   said system having a gradient-coil subsystem for imposing a gradient on the static magnetic field, the gradient producing a variation in magnetic-field intensity as a function of position in a region in which the gradient is effective, an improved gradient-coil apparatus for imposing a gradient on the static magnetic field,
   the improved gradient-coil apparatus adding to such axially-directed field a magnetic field having a gradient in a direction transverse to the axis, the gradient-coil apparatus including at least one coil having conductive elements which are curved to define a plurality of generally hyperbolically-shaped electrically-conductive paths.

12. An improved gradient-coil apparatus according to claim 11, wherein the gradient-coil apparatus is positioned on a cylindrical surface surrounding the selected region, the cylindrical surface having an axis coaxial with the axis of the magnet for providing the static magnetic field, the hyperbolically-shaped electrically-conductive paths being adapted to carry a fixed current, the conductive paths being located to provide a predetermined set of current densities in surface areas of the cylinder.

13. An improved gradient-coil apparatus according to either of claims 11 or 12, wherein the surface or surfaces surrounding the selected region has a midplane intersecting the axis along which the magnetic field is directed, the current densities of the gradient-coil apparatus, when generating the gradient magnetic field, varying at positions in proximity to the surface or surfaces as a function of distance from the midplane, the current density near the midplane being constant, increasing slightly at increasing distance from the midplane, decreasing to a minimum at further increased distance from the midplane, and at still further increased distance from the midplane increasing to a maximim current density.

14. An improved gradient-coil apparatus according to claim 11, wherein the surface or surfaces in proximity to which the conductor of conductors provide a plurality of current paths includes a cylinder having an axis coaxial with the axis of the magnet for providing the static magnetic field, the cylindrical surface having a midplane intersecting the axis, the predetermined error relationship of the gradient magnetic field being present when current densities around the circumference of the cylindrical surface and at the midplane have a sinusoidal variation.

15. An improved gradient-coil apparatus according to claim 12, wherein the cylindrical surface has a circumferential line along which the current density varies sinusoidally when the predetermined error relationship of the magnetic field in the selected region is present.

16. An improved gradient-coil apparatus according to claim 1, wherein the magnet for providing the static magnetic field has an axis, the static magnetic field being axially-directed, the improved gradient-coil apparatus adding to such axially-directed field a magnetic field having a constant gradient in a direction, the gradient-coil apparatus including at least one coil having conductive elements, such conductive elements being spaced along the axis, the conductive elements being spaced from one another to produce selected net-current-densities in proximity to the surface or surfaces, the net current densities being selected to produce the least-squares error relationship in the selected region.

17. An improved gradient-coil assembly according to claim 16, wherein the surface or surfaces includes a cylinder, the conductive elements in proximity thereto being spaced from one another symmetrically with respect to a midplane along the cylinder, the conductive elements having sections wherein the currents in the conductive elements in directions perpendicular to the axis of the cylinder are oppositely directed.

18. In a system for generating magnetic resonance in materials placed in the system for examination, the system having a magnet for providing a static magnetic field and having a gradient-coil subsystem for imposing a gradient on the static magnetic field, the gradient producing a variation in magnetic-field intensity as a function of position in a region in which the gradient is effective, an improved gradient-coil apparatus for imposing a gradient on the static magnetic field in a selected region of predetermined volume, the apparatus comprising:

(a) at least one surface surrounding the selected region, the surface encompassing a volume substantially larger than the selected region; and (b) at least one electrical conductor positioned in proximity to the surface or surfaces, the conductor or conductors providing a plurality of current paths on the surface or surfaces, current when flowing through such current paths generating a magnetic field intensity in the selected region which magnetic field intensity has a predetermined error relationship with respect to a desired characteristic for the gradient imposed on the static magnetic field, wherein the magnet for providing the static magnetic field has an axis, the static magnetic field being axially-directed, the improved gradient-coil apparatus adding to such axially-directed field a magnetic field having a constant gradient in a direction, the gradient-coil apparatus including at least one coil having conductive elements, such conductive elements being spaced along the axis, the conductive elements being spaced from one another to produce selected net-current-densities in proximity to the surface or surfaces, the net current densities being selected to produce the predetermined error relationship in the selected region, and wherein the conductive elements in proximity to the surface or surfaces have a generally hyperbolic shape.

* * * * *